(12) United States Patent
Sita et al.

(10) Patent No.: US 11,275,109 B2
(45) Date of Patent: Mar. 15, 2022

(54) APPARATUS, SYSTEM, AND METHOD FOR AN INTEGRATED CIRCUIT

(71) Applicant: SRI International, Menlo Park, CA (US)

(72) Inventors: Richard Sita, Audubon, NJ (US); Michael G. Kane, Princeton, NJ (US)

(73) Assignee: SRI International, Menlo Park, CA (US)

( * ) Notice: Subject to any disclaimer, the term of this patent is extended or adjusted under 35 U.S.C. 154(b) by 149 days.

(21) Appl. No.: 16/490,247

(22) PCT Filed: Mar. 7, 2018

(86) PCT No.: PCT/US2018/021347
§ 371 (c)(1),
(2) Date: Aug. 30, 2019

(87) PCT Pub. No.: WO2018/165303
PCT Pub. Date: Sep. 13, 2018

(65) Prior Publication Data
US 2020/0072899 A1    Mar. 5, 2020

Related U.S. Application Data

(60) Provisional application No. 62/468,198, filed on Mar. 7, 2017.

(51) Int. Cl.
*G01R 31/28* (2006.01)
*H01L 21/66* (2006.01)
*H01L 21/78* (2006.01)

(52) U.S. Cl.
CPC ..... *G01R 31/2884* (2013.01); *G01R 31/2822* (2013.01); *H01L 21/78* (2013.01); *H01L 22/14* (2013.01); *H01L 22/32* (2013.01)

(58) Field of Classification Search
CPC . G01R 31/2884; G01R 31/2822; H01L 21/78; H01L 22/14; H01L 22/32; H01L 21/70; G06K 19/0723
See application file for complete search history.

(56) References Cited

U.S. PATENT DOCUMENTS 6,715,105 B1    3/2004  Rearick
7,015,823 B1    3/2006  Gillen et al.
(Continued)

FOREIGN PATENT DOCUMENTS

JP          05-343492 A    12/1993

OTHER PUBLICATIONS

International Search Report and Written Opinion, PCT/US2018/021347, ISA:US dated Jul. 19, 2018, 15 pp.

*Primary Examiner* — Christopher P McAndrew
*Assistant Examiner* — Zannatul Ferdous
(74) *Attorney, Agent, or Firm* — Rutan & Tucker, LLP

(57) ABSTRACT

Manufacturing integrated circuits is discussed with steps as follows. Creating a wafer with a plurality of dies, where each die contains its own integrated circuit. Fabricating multiple instances of TAP circuitry located in a margin between dies of the wafer. Fabricating on the wafer one row of test pads and power pads per group of dies on the wafer, where the row of test pads and power pads is electrically connected and shared among all of the dies in the group. The test and power pads connect to a chain of TAP circuitry in order to supply operating power as well as testing data to verify the integrity of each die in that group of dies. Singulating the dies to create each instance of the integrated circuit, and during the singulation process, the TAP circuitry located in the margin between the dies is destroyed.

17 Claims, 12 Drawing Sheets

(56) References Cited

U.S. PATENT DOCUMENTS

| | | | |
|---|---|---|---|
| 9,791,346 B1* | 10/2017 | Carpentier | G01M 11/33 |
| 2001/0051404 A1 | 12/2001 | Hiroshi et al. | |
| 2005/0156318 A1 | 7/2005 | Douglas | |
| 2009/0235136 A1 | 9/2009 | Whetsel | |
| 2010/0047564 A1 | 2/2010 | Kim et al. | |
| 2010/0163871 A1 | 7/2010 | Brambilla et al. | |
| 2010/0315153 A1 | 12/2010 | Oksanen et al. | |
| 2011/0204917 A1* | 8/2011 | O'Neill | H01L 23/481 |
| | | | 326/38 |
| 2013/0232587 A1 | 9/2013 | Boday et al. | |
| 2014/0002122 A1* | 1/2014 | Dibattista | G06F 30/392 |
| | | | 324/750.24 |
| 2014/0042627 A1 | 2/2014 | Edelstein et al. | |
| 2017/0154853 A1* | 6/2017 | Pueschner | H01L 21/78 |
| 2018/0276420 A1 | 9/2018 | Kane | |
| 2019/0259685 A1* | 8/2019 | Hussain | H05K 1/181 |

* cited by examiner

APPARATUS, SYSTEM, AND METHOD FOR AN INTEGRATED CIRCUIT

CROSS-REFERENCE

This application is a 35 U.S.C. § 371 U.S. National Stage of International Patent Application No. PCT/US2018/021347, titled "APPARATUS, SYSTEM, AND METHOD FOR AN INTEGRATED CIRCUIT" having an International Filing Date of Mar. 7, 2018 which claims priority under 35 USC 119 to U.S. provisional patent application Ser. 62/468,198, titled "Ultra-miniature application-specific integrated circuit apparatus, system and methods," Filed: 7 Mar. 2017, the disclosure of which is incorporated herein by reference in its entirety.

GOVERNMENT RIGHTS

This invention was made with government support under contract number HR0011-15-C-0010 awarded by the Defense Advanced Research Projects Agency. The government has certain rights in the invention.

TECHNICAL FIELD

Embodiments of this disclosure relate generally to integrated circuits, such as application-specific integrated circuits (ASICs). More specifically, an embodiment relates to ultra-miniature ASIC devices and systems, and to methods for programming and testing such devices and systems. Even more specifically, aspects of this embodiment relate to miniature RFID (radio frequency identification) components for tagging and/or tracking.

SUMMARY

Provided herein can be various methods, apparatuses, and systems for an integrated circuit.

In an embodiment, a method of manufacturing an integrated circuit is discussed. The method includes steps such as the following. Creating a wafer with a plurality of dies, where each die contains its own integrated circuit that needs its integrity verified. Fabricating test circuitry, including multiple instances of test access port (TAP) circuitry, located in a margin between dies of the wafer. Fabricating, on the wafer, a first row of test pads and power pads per group of dies on the wafer, where the row of test pads and power pads is electrically connected and shared among all of the dies in the group. Multiple test pads and multiple power pads connect to a chain of multiple instances of the TAP circuits in order to supply operating power as well as testing data to verify an integrity of each die in that group of dies. Singulating the dies to create each instance of the integrated circuit, and during the singulation process, the test circuitry, including the multiple instances of TAP circuits, located in the margin between the dies, is destroyed.

Many embodiments are discussed.

DRAWINGS

The drawings refer to some embodiments of the design provided herein in which:

FIG. 1 illustrates a diagram of an embodiment of a slice group of dies on a wafer where each die fabricated on the wafer in that group geographically has no test pads or other input pads instantiated on the die itself; and instead, each die and its associated TAP circuitry receives its test signaling and power from the one row of test and power pads per group of dies on the wafer, during the fabrication testing process.

Figure 11:
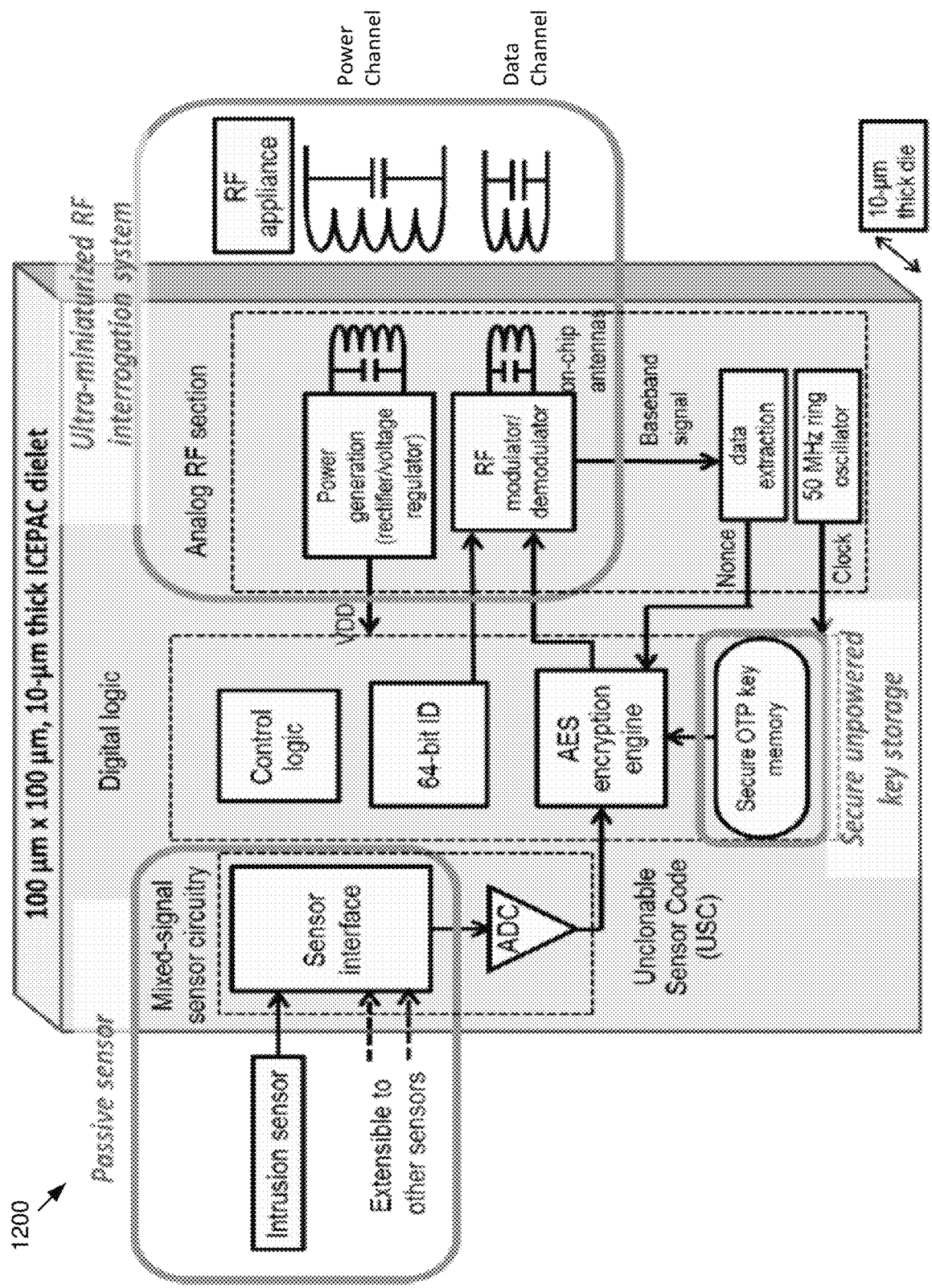

FIG. 11 illustrates a diagram of an embodiment of an example instance of an Application Specific Integrated Circuit with Radio Frequency Identification components and circuitry for tagging/tracking, where the ASIC contains an unclonable password in its memory because the fabricated ASIC, after a singulation process, has no test pads or power pads geographically on the singulated ASIC for wires of an external tester to connect to.

Figure 12:
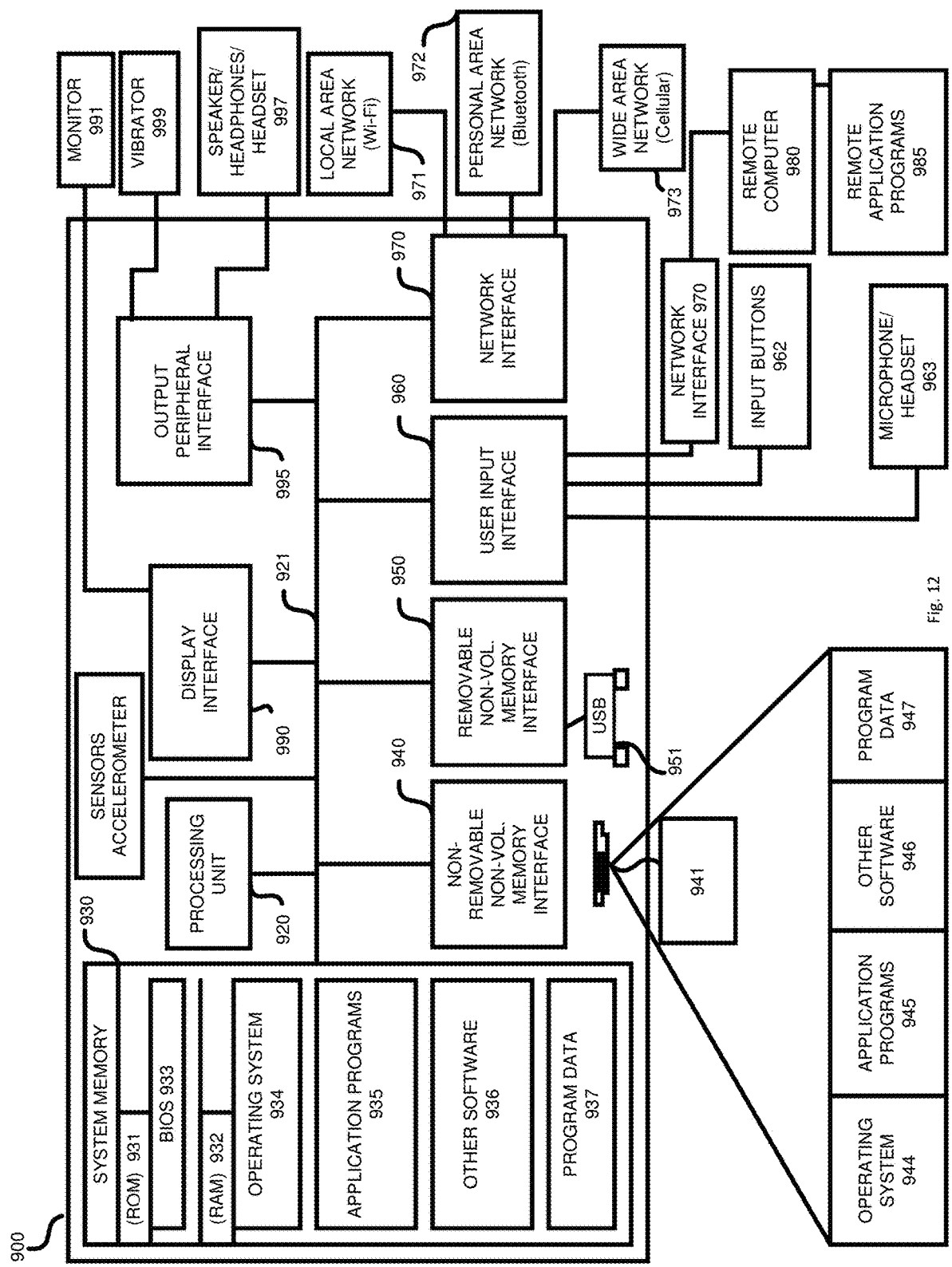

FIG. 12 illustrates an embodiment of one or more computing devices that can be a part of the system to manufacture an integrated circuit discussed herein.

While the design is subject to various modifications, equivalents, and alternative forms, specific embodiments thereof have been shown by way of example in the drawings and will now be described in detail. It should be understood that the design is not limited to the particular embodiments disclosed, but—on the contrary—the intention is to cover all modifications, equivalents, and alternative forms using the specific embodiments.

DESCRIPTION

In the following description, numerous specific details can be set forth, such as examples of specific data signals, named components, number of frames, etc., in order to provide a thorough understanding of the present design. It will be apparent, however, to one of ordinary skill in the art that the present design can be practiced without these specific details. In other instances, well known components or methods have not been described in detail but rather in a block diagram in order to avoid unnecessarily obscuring the present design. Further, specific numeric references such as the first computing device, can be made. However, the specific numeric reference should not be interpreted as a literal sequential order but rather interpreted that the first computing device is different than a second computing device. Thus, the specific details set forth can be merely exemplary. The specific details can be varied from and still be contemplated to be within the spirit and scope of the present design. The term "coupled" is defined as meaning connected either directly to the component or indirectly to the component through another component.

In general, one or more embodiments of an integrated circuit with a one-time programmable memory that has no input pins or power input pins is discussed. Each die fabricated on the wafer geographically has no test pad or other input pad instantiated on the die itself; and instead, receives its test signaling and power from a row of test pads and power pads per group of dies on the wafer during the fabrication and testing process. Also, an integrated circuit, manufactured from the die, has an inductive-capacitive circuit to wirelessly receive its operational power during its operation from an external wireless reader because the row of test pads and power pads was severed off during a die singulation process.

Figure 1:
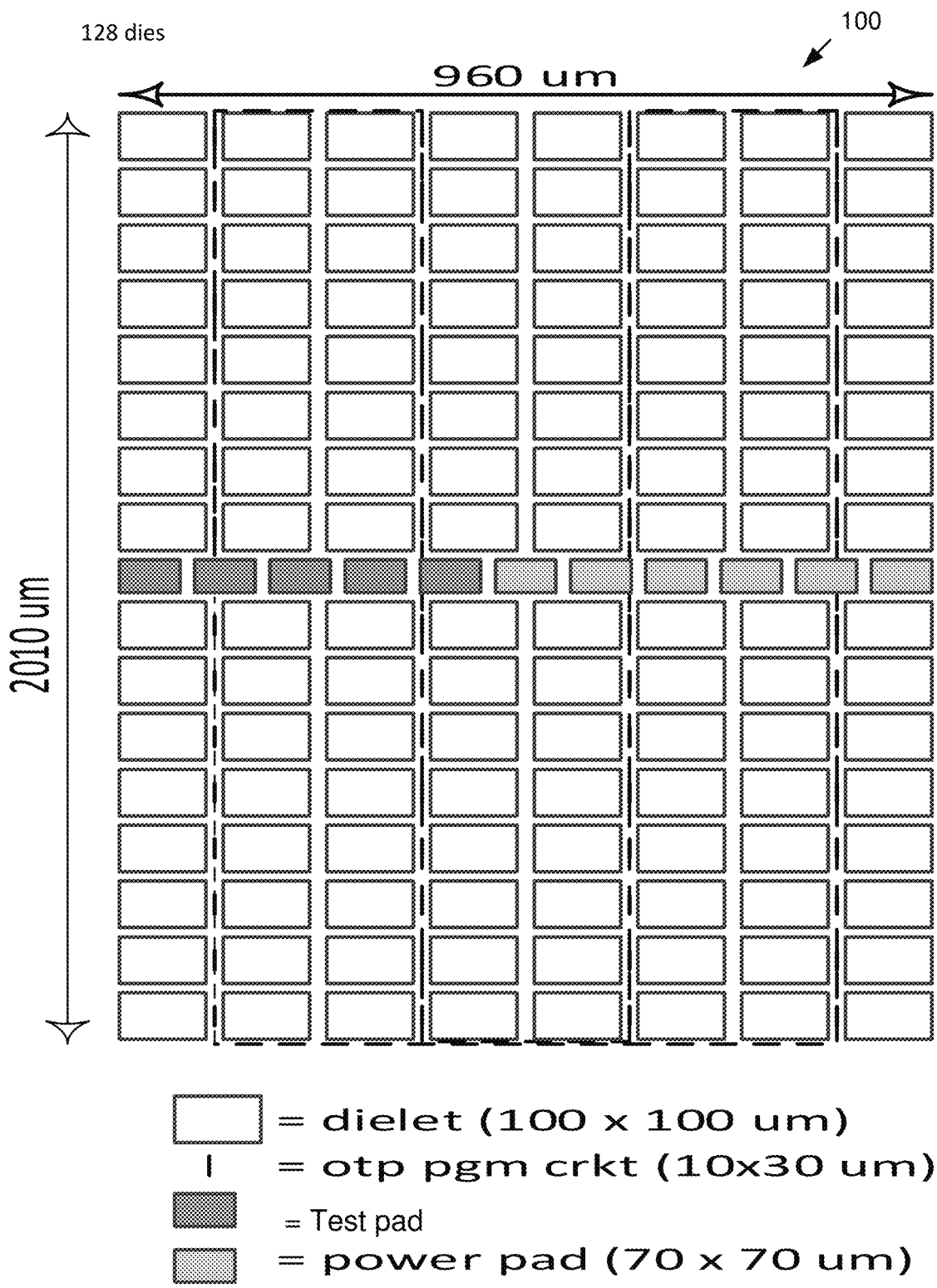

FIG. 1 illustrates a diagram of an embodiment of a slice group of dies on a wafer where each die fabricated on the wafer in that group geographically has no test pads or other input pads instantiated on the die itself; and instead, each die and its associated Test Access Port (TAP) circuitry receives its test signaling and power from the one row of test and power pads per group of dies on the wafer, during the fabrication testing process.

Referring to FIG. 1, the example slice group 100 in FIG. 1 has the following attributes: eight columns and sixteen rows of dies making one hundred and twenty-eight dies per slice group; sixty-four TAP circuits (two dies per de-serializer in a TAP circuit) located between the dies and connected in a serial chain; and one row of five test pads—Shift_In, Shift_Out, Shift_En, Shift_Clk, SMode (to select scan test or OTP), and six power pads—vPP, vQQ, vRR, vDD, two for vSS. In the figure, each dark line between the left and right adjacent dies is a TAP circuit. The TAP circuit supplies test data to those adjacent dies and then sends the output data on its own data bus in parallel. The external tester's probes make contact with the example five test pads as well as contact with the example six power pads.

The wafer is created with a plurality of dies. Each die needs its integrity verified with the TAP circuits after being manufactured. Accordingly, the test circuitry, including multiple instances of test access port (TAP) circuitry, is fabricated in a margin/street between dies of the wafer. Note, the whole wafer or part of the wafer may have its integrity verified. The test circuitry is configured to support programming content into an internal read-only memory on each die and to support wafer-level testing of each die.

Again, the TAP circuits are geographically located in the margins between dies on the wafer. Each slice group is tightly packed within the narrow margins between dies in the slice group. The narrow margins allow more dies to be placed on a same sized wafer. Thus, a multiplicity of TAP circuits are connected serially within the slice. The circuitry of the TAP circuits is located in the margins between dies (e.g. in otherwise unused space). The first and last TAP controller in the serial chain are connected to the row of test pads.

Two reasons for locating the TAP circuits in the margins include:
1) There is an opportunity to share a de-serializer in a TAP circuit to program more than one OTP (in different dies). The advantages being:
   a. To enable multiple OTPs to be programmed simultaneously; thus, reducing overall programming time at the wafer level.
   b. Reduce the length of the slice programming word (and therefore shift time), which is directly proportional to the number of de-serializers in the chain.
   c. Fewer de-serializers means lower power consumption, which could allow for a faster tester clock frequency.
2) A parallel interface into the die makes it harder for an adversary to successfully hack into the OTP of a singulated die because, for example, at least eleven pins, five test pins and six power pins, would need to be accessed.

The TAP circuits are connected in series. The multiple TAP circuits can be connected serially within the group as a serial scan chain. The length of the chain is scalable—it can be any number up to the total number of dies on the wafer.

A small TAP circuit with its OTP programming circuit is located in the streets, between dies, and this will be obliterated or destroyed during the die singulation process. Thus, the dies are singulated to create each instance of the integrated circuit. During the singulation process, the test circuitry, including the multiple instances of TAP circuitry, located in the margin between the dies, is destroyed. The streets of the wafer can be margined to roughly 100 μm, which allows singulation with either a saw or via etch.

In an example tester, a parallel interface from the external tester may have, for example, 23 wires. A serial interface from that tester would require fewer test pads and wires but requires logic to de-serialize, such as eleven wires and corresponding pads. As discussed, the TAP circuitry is located outside the die in the streets. Again, a strong reason to locate this TAP circuitry in the streets and maintain a parallel interface to the die is related to security. The more wires and corresponding test and power pads severed during singulation makes it harder for an adversary to resurrect a functional interface to the OTP memory. Additionally, although small, the programming circuitry still represents area and power that has no operational use after creation of the final integrated circuit. The OTP programming and scan test circuitry (deserializer) in the TAP circuit for the proposed design is fairly simple and can be estimated to occupy, for example, about 300 micrometers squared to comfortably fit in the margin (80 um×40 um=320 um2 available).

Next, various pads provide access to power and data from an external tester to the dies on the wafer. The test pads and power pads are geographically located on the wafer external to the dies in the group. An example number of, one, row of test pads and power pads per group of dies on the wafer are fabricated on the wafer. The row of test pads and power pads are electrically connected and shared among all of the dies in the group. An external tester accesses the TAP circuitry via the row of test pads and power pads per group of dies on the wafer. Multiple test pads and multiple power pads connect to a chain of multiple instances of the TAP circuitry in order to supply operating power as well as testing data to verify an integrity of each die in that group of dies. Note, the test pads and power pads are geographically located on the wafer external to the dies in the group.

Each TAP circuit has a scalable controller to interface with two or more dies. Each TAP circuit also includes logic to access circuitry of connected dies undergoing a scan test. The TAP circuitry also includes logic to access and program information for an embedded memory of the connected dies for OTP programming. The TAP circuitry also includes mode circuitry to configure routing paths and components in the TAP circuit to supply the scan test data and collect the resulting the scan test data as well as to configure routing paths and components in the TAP circuit to program information for each individual die in the group of dies.

The multiple instances of TAP circuits are connected serially within the slice group. The first and last TAP circuit in the serial chain of instances of TAP circuits are connected to the first row of test pads and power pads for that group of dies. An external tester supplies data and makes connections as if that tester is testing a single die; however, the entire slice group of dies is tested by that external tester with essentially a same set of data and connections as if that external tester is testing a single die.

Some digital logic of the die is tested with SCAN chains and SCAN test vectors via the power and test pads through the TAP circuits. Special SCAN flip-flops can be substituted in the design to support this type of testing. It is an excellent test methodology with extremely good fault coverage and low tester time.

In an embodiment, an intention is to program the on-board One Time Programming memory during wafer-level test using a commercial tester (e.g. Terradyne J750) and probecard. Challenges include that the pads for probing is almost as big as a die. Thus, each pad eliminates one or more potential dies site on the wafer if made part of the fabricated die. The OTP requires access to, for example, 11 to 23 pins to do the programming. The row of pads can be as long as the number of pads needed for testing with the tester. The OTP programming pins/pads will be severed off during die singulation; the final die has no IO pins/pads at all. Some of the OTP programming circuitry could be located in the margins between dies and also destroyed as part of the singulation process. Once the OTP is programmed, the OTP programming pads for external wires are severed off during die singulation.

This process can create instances of an integrated circuit with a one-time programmable memory that has no input pins or power input pins. Each die fabricated on the wafer geographically has no test pads or other input pads instantiated on the die itself; and instead, receives its test signaling and power from the one row of test pads and power pads per group of dies on the wafer, during the fabrication and testing process. Each die has an antenna circuit to wirelessly receive its operational power during its operation from an external wireless reader because these pins were severed off during a die singulation process.

In an embodiment, an example integrated circuit fabricated on the wafer is an Application Specific Integrated Circuit with Radio Frequency Identification components and circuitry for tagging/tracking. The ASIC contains an unclonable password in its memory because the fabricated ASIC, after a singulation process, has no test pads or power pads geographically on the singulated ASIC for wires of an external tester to connect to.

In embodiment, two or more parallel data buses rows of data are instantiated between columns of dies to route data shifted out of the TAP circuits. The instances of the TAP circuits are connected in a chain and are configured to supply test data to their adjacent dies. The instances of the TAP circuits connected to a first column of dies then send their output data on a first data bus in parallel to the instances of the TAP circuits connected to a second column of dies, which then send their output data on a second data bus, which both effectively cuts down a length of the scan chain of TAP circuits to save tester time and simplifies keeping track of the output data from the columns of dies. Again, a slice group of dies is flexible in that it accommodates a scalable number of dies per TAP circuit, and any number of TAP circuits in its chain length.

Each TAP controller has a packet format configured for communicating test and programming information to each individual die. In an embodiment, a TAP controller interfaces with a first ASIC on the left of the TAP controller and a second ASIC on the right of the TAP controller. In an embodiment, a TAP controller interfaces with a first ASIC on the upper left of the TAP controller, a second ASIC on the lower left of the TAP controller, a third ASIC on the upper right of the TAP controller, and a fourth ASIC on the lower right of the TAP controller.

Figure 2:
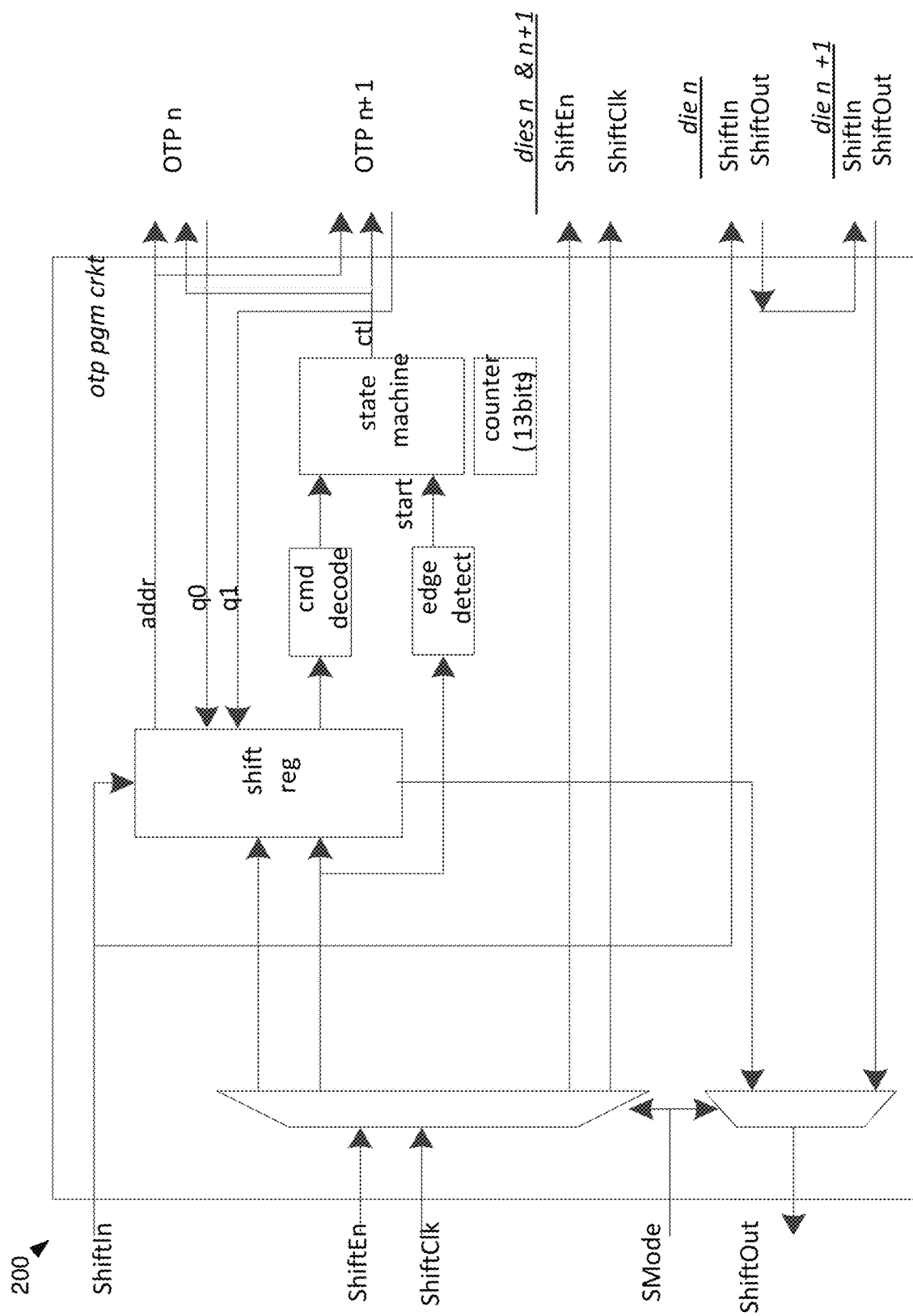
FIG. 2 illustrates a diagram of an embodiment of an example instance of a TAP circuit containing both One Time Programming (OTP) circuitry and scan test circuitry.

FIG. 2 illustrates a diagram of an embodiment of a TAP circuit containing both OTP programming circuitry and scan test circuitry.

Referring to FIG. 2, an example TAP circuit 200 contains a combination of a shift register, a state machine, multiplexers coupled to the Shift_In input, Shift_Out output, Shift_Clock input, Shift_Enable input, and SMode select input, an edge detect circuit, a command decode circuit, a state machine, a counter, and numerous routing paths for passing this scan test data and OTP content. The instances of the TAP circuitry contain circuitry for both scan data testing and performing programming values in memories on each connected die, as well as contain circuitry for switching modes between scan data testing and performing programming values.

The state machine can be set up to configure the TAP circuit to operate in one of two modes: OTP Programming or scan test based on the sMode input.

Figure 4:
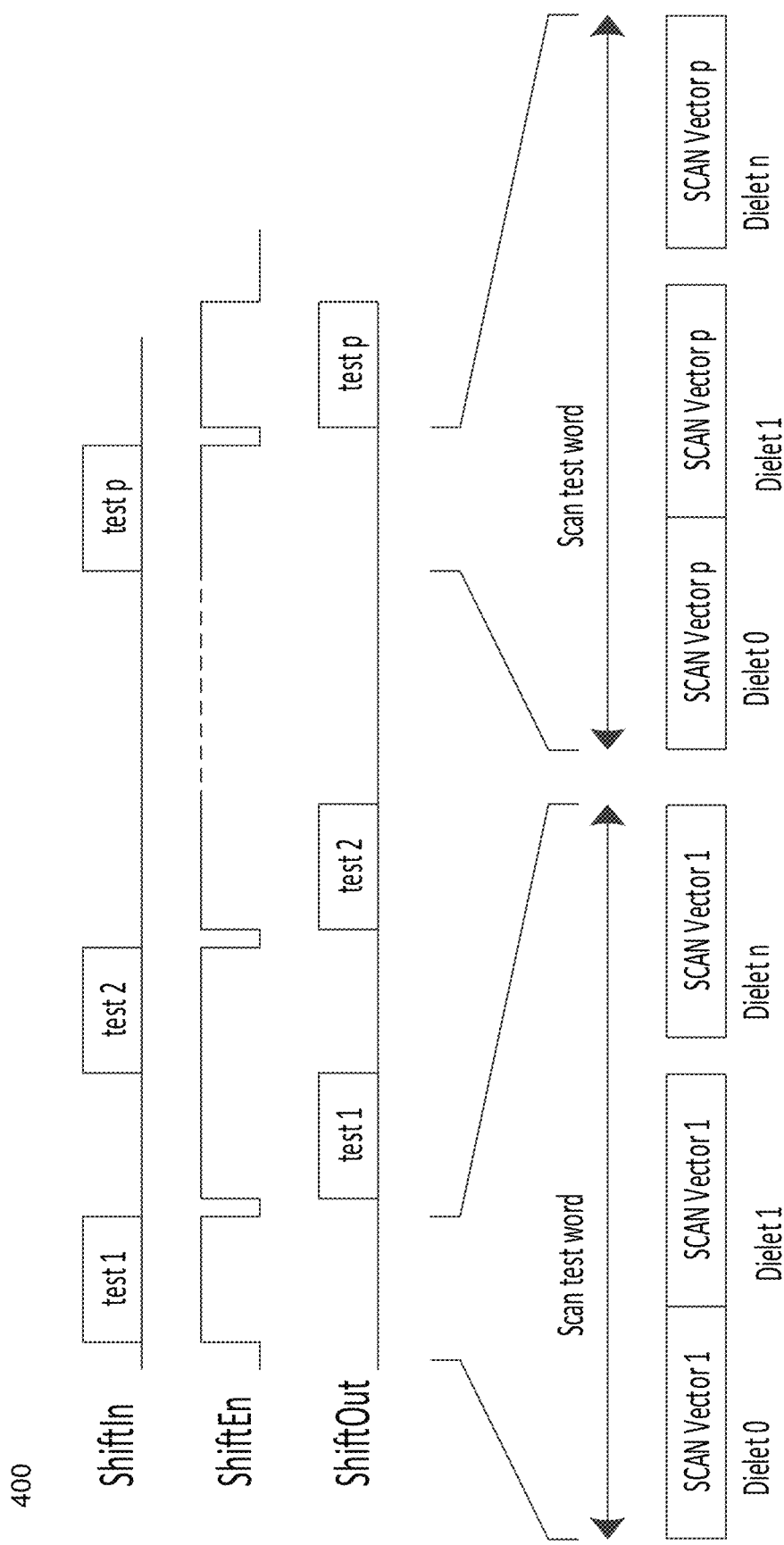
FIG. 4 illustrates a diagram of an embodiment of an example scan test timing shifting in scan test words and scanning out the resulting data.

In the scan test mode, the TAP circuit can shift in scan testing data and then shift out that test data. See FIG. 4 for an example scan test timing shifting in scan test words and scanning out the resulting data. The SCAN testing occurs where the SCAN chain is serialized through all dies in a slice group. This enables all dies to share one scan port (e.g. 4 test pads).

Each TAP circuit contains a combination of a shift register, a counter and a state machine to individualize the programming information in the embedded memory of each connected die. The embedded memory can be an embedded read-only memory. The programming information into the embedded read-only memory can be one time programming information of security content in the embedded read-only memory of a connected die. The programmed security content in the embedded read-only memory of a first die connected to that TAP circuit is different in security content than security content programmed into the embedded read-only memory of a second die connected to that TAP circuit. The same process occurs for each connected die.

The OTP can be programmed through some of the same SCAN chain wiring and circuitry in the TAP circuit.

Figure 5:
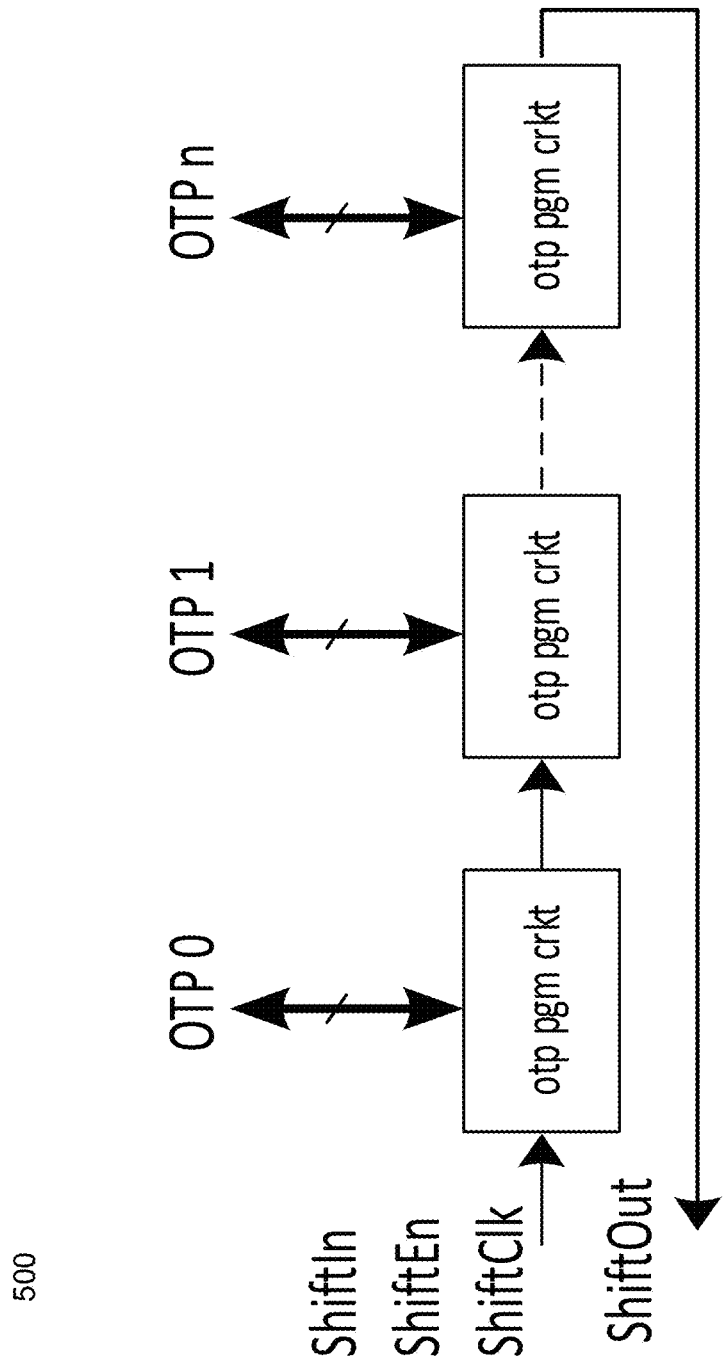
FIG. 5 illustrates a diagram of an embodiment of an example of One Time Programming of unique data in the daisy chain of dies and associated TAP circuits in the slice group.
Figure 6:
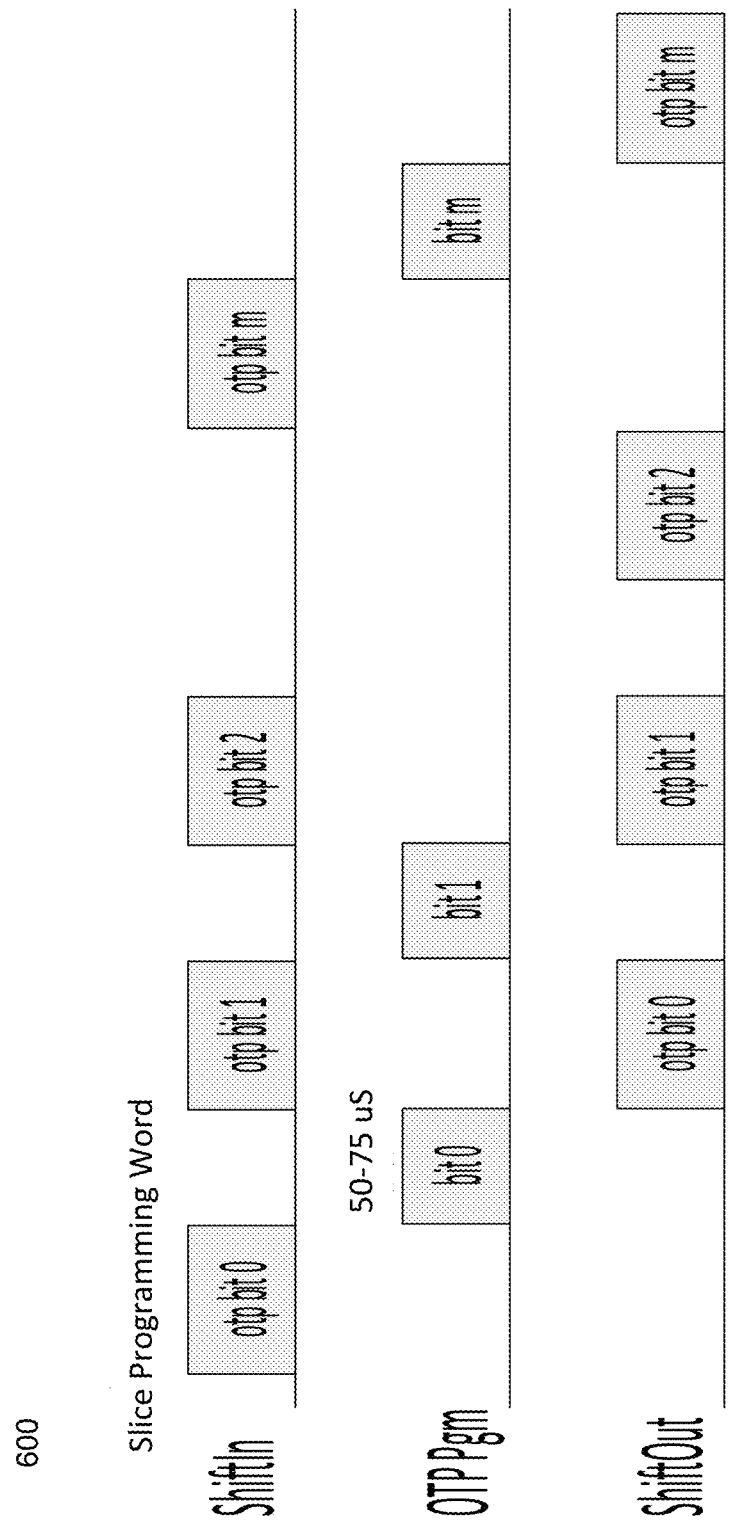
FIG. 6 illustrates a diagram of an embodiment of example cycles and timing of One Time Programming in a die and its associated TAP circuit.

In the OTP mode, the TAP circuit can shift in OTP data. See FIG. 6 for the example OTP programming cycle—timing. Also see FIG. 5 for an example of OTP programming of unique data in the daisy chain of dies and associated TAP circuits in the slice group.

Figure 10:
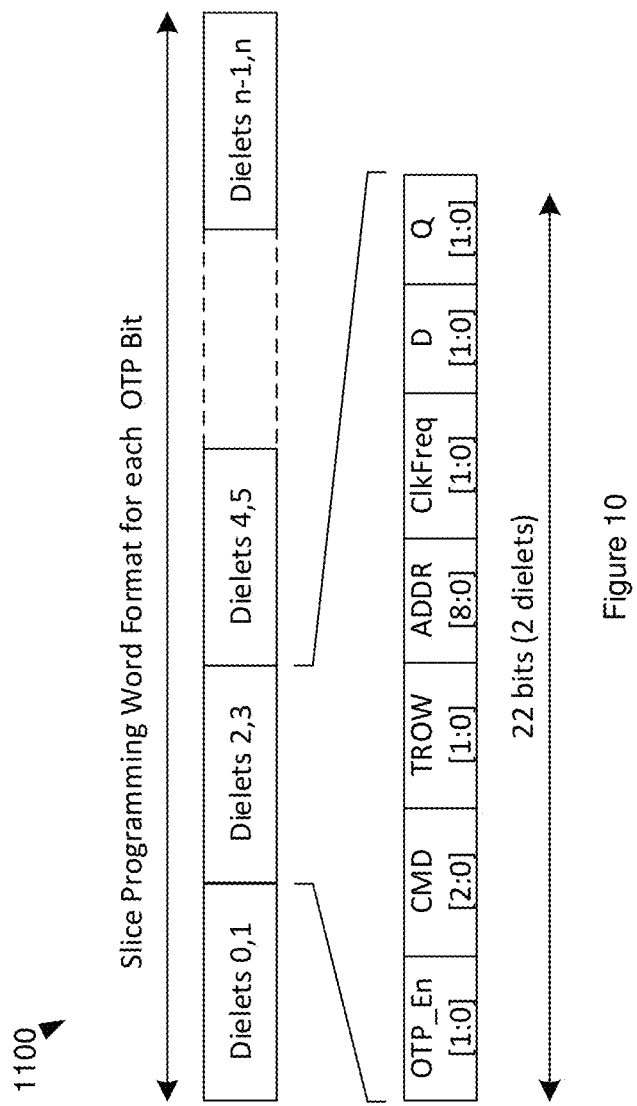
FIG. 10 illustrates a diagram of an embodiment of an exemplary slice programming word format for each OTP bit.

Note, in an embodiment, an exemplary slice programming word format is presented in FIG. 10 for the illustrative design. The format is flexible in that it accommodates any number of dies per TAP circuit, and any chain length. A separate enable (Shift_Enable) is provided for each OTP to provide individual control for soak/repair operations. An address field is included to support random addressing for soak/repair of particular OTP bits. The tester clock frequency so that the OTP programming circuit can count out the proper write pulse width. A field is allocated for the Q bit, the idea is that the OTP programming circuit will first "write" the bit; and then it will "read" the bit and place it into the Q field for verification back at the tester. Additional fields could be allocated to report other test status from the die (such as the result of a BIST).

Figure 3:
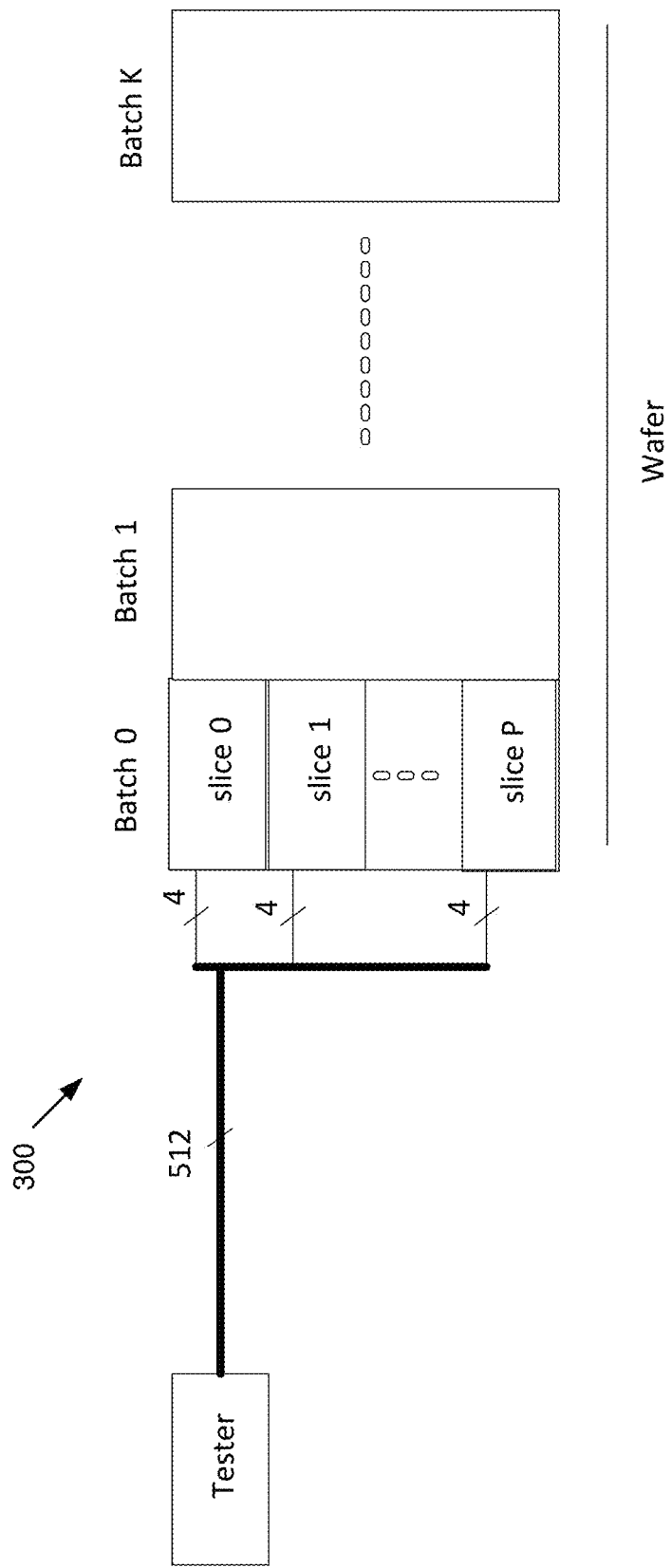
FIG. 3 illustrates a diagram of an embodiment of an external tester supplying data and making connections as if that external tester is testing a single die; however, the entire slice group of dies will be tested by that external tester with essentially a same set of data and connections as if that external tester is testing a single die.

FIG. 3 illustrates a diagram of an embodiment of an external tester 300 supplying data and making connections as if that external tester is testing a single die. Note, the system forms a test-group (batch) comprised of many slices . . . as many as the tester IO pin count will support. Then the test-group (batch) is tested/programmed in parallel The entire batch including slices of dies will be tested by that external tester with essentially a same set of data and connections as if that external tester is testing a single die. Batches of dies on the wafer will be tested in parallel, such as Batch O through Batch K. Within each individual batch of dies being tested in parallel, slice groups of dies, each slice group formed from its own chain of TAP circuits and row of power and testing pads, will also be tested in parallel with essentially a same set of data and connections as if that external tester is testing a single die. See also FIG. 7.

Operationally, a data stream is shifted into the OTP programming circuit structure of each die in a slice; once all the bits are shifted in, the first address of all OTPs is programmed simultaneously into each die in the chain of dies forming that slice. The process is then repeated for all addresses. When the data stream of the second address is shifted in, the previous data stream (from the first address) appears on the ShiftOut signal; this provides an opportunity for the OTP programming circuit to return status, such as whether the bit was successfully programmed or not.

The time required to program a set of OTPs with this method is the sum of the time spent shifting and the time spent programming:

PgmTime=NumOtpBits*ShiftInTime+ NumOtpBits*OtpBitPgmTime+ShiftOutTime

Similarly, scan testing of the digital circuitry can utilize the same IO pads and wiring. The concept is slightly different in that the scan daisy-chain will go through each die, with each die receiving an identical test vector. The test time is determined as follows:

ScanTestTime=(NumFF/die*NumDie/ slice*NumTestVectors+1)*ShiftInTime

Again, the system can now perform both parallel testing and programming on the batch of dies as well as to multiple dies connected to each TAP circuit in the chain of TAP circuits. The test batches are being tested in parallel as well as within a batch a number of slice groups are being tested in parallel. Each slice group is tested and programmed as a unit, even though it contains many dies. Tester time dramatically reduced by high degree of parallelism (see FIG. 8). Also the number of slices in a test group can be tailored to the available testers to minimize overall test cost (see FIG. 9). For example, a common digital ASIC tester with 512 channels can simultaneously test 32 slice groups, each group having multiple dies such as 128 dies.

The setting of group size of dies/slice size is set to optimize an amount of tester time taken and increase an amount of dies packed with small margins in between dies per wafer. The scalability of how big a slice group can be is generally based on tester time, amount of testers available, and this is weighed with the bigger a slice is in terms of number of dies, if a defective TAP circuit is produced in the chain of TAP circuits in any of the test TAP circuits, then all of the dies in the slice can be considered defective.

A slice group is comprised of, for example, a multiplicity of die units plus one shared set of test circuitry. By sharing the test circuitry among many dies, the area ratio of yieldable product to test circuitry can be greatly improved. The described methods are scalable; and thereby, enable an economic tradeoff to be made regarding the number of dies in a slice for optimizing overall unit cost of each die and resulting integrated circuit. Further, the disclosed methods do not essentially add to the area of the die and can be shared among multiple dies.

Figure 7:
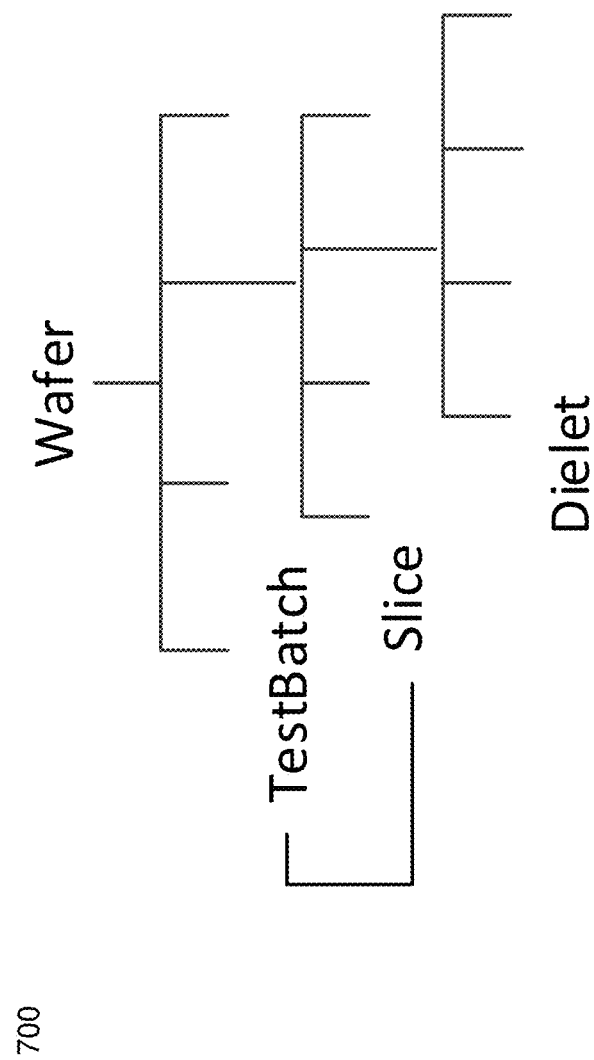
FIG. 7 illustrates a diagram of an embodiment of an example system for improved wafer area utilization for dies by using scalable methods via a parallel testing and programming hierarchy of test batches and slice groups of dies within a test batch.

FIG. 7 illustrates a diagram of an embodiment of an example system for improved wafer area utilization for dies by using scalable methods via a parallel testing and programming hierarchy of test batches and slice groups of dies within a test batch. Referring now to FIG. 7, scalable methods of testing and programming ultra-miniature ASICs for improved wafer area include: a hierarchical method of physical implementation to improve wafer area utilization; a hierarchical method of ASIC testing to improve wafer area utilization; an area-efficient means of initializing one-time programmable memory on ultra-miniature ASICs; and an area-efficient means of testing ultra-miniature ASICs.

In current implementations, a high-density test-pad site is at least 50 um×50 um, with a pitch of 70 um, with at least 6 pads required to test an ASIC based on commonly used "scan" testing. Using a 3×2 staggered configuration, the test pad site would be 230 um×140 um. An example ultra-miniature ASIC dimension is 100 um×100 um. The result is that only 24% of the total wafer area represents yieldable product with the remaining 76% dedicated to the test pads. Furthermore, programming a memory device, embedded within the ASIC, typically requires many more (than 6) test pads to form an address bus and control signals, further eroding the area utilization. Additionally, since the problem is one of relative dimensions among test circuitry and product circuitry, scalability is essential to achieving an economic balance in the general case.

Another known limitation is the "scribe-street" width, the margin between adjacent ASICs. Although smaller margins are possible, a typical width is 80 um, which accommodates the kerf of the dicing saw blade, and provides silicon area for the ASIC foundry to place "wafer acceptance test" (WAT) circuitry. Compared to the dimensions of the example 100 um×100 um ultra-miniature ASIC, the result is that only 31% of the total wafer area represents yieldable product with the remaining 69% dedicated to scribe-streets.

Area utilization can be optimized with a hierarchical floorplan as shown in FIG. 7. Provided for delivery to the foundry are a reticle design, a collection of ASICs, as if it was a single design. Larger exterior margins may exist outside of the reticle and can contain the foundry's WAT circuitry. Within the reticle, narrower interior margins are used, which include the test circuitry. This method allows us to maintain a high utilization within the reticle.

The reticle can be sub-divided into multiple identical slices; each containing a number of dies/ASICs optimized for test implementation purposes. Each slice has its own set of probe test pads for power, test, and OTP (one time programmable) programming. A slice can be as large as a reticle.

The hierarchical floorplan provides a layered, scalable means of independently optimizing silicon area utilization and ASIC test implementation (including OTP programming).

The hierarchical floorplan is comprised of slices, which allows us to introduce the concept of a "Test batch". As shown in FIG. 7, the Test batch is also comprised of a number of slices, but not necessarily the same as the Reticle. In other words, the Test batch is a "logical" grouping of slices whereas the reticle is a physical grouping of slices. Since the wafer comprises a regular pattern of reticles and slices, a probe card and step-and-repeat pattern can be designed for testing that is based on Test batches, rather than Reticles.

Using the Test batch, the wafer test process is fully scalable, enabling wafer test processing to be economically optimized for different testers, even after the wafer has been manufactured. Testing can be performed on a slice basis, a reticle basis, a sub-reticle basis, a multiple-reticle basis, or even across reticles.

FIG. 11 illustrates a diagram of an embodiment of an example instance of an Application Specific Integrated Circuit with Radio Frequency Identification components and circuitry for tagging/tracking. The ASIC contains an unclonable password in its read-only memory because the fabricated ASIC, after a singulation process, has no test pads or power pads geographically on the singulated ASIC for wires of an external tester to connect to.

Ultra-miniature application-specific integrated circuits can have many implementations. One example is an "unclonable" RFID (radio frequency identification) chip, such as described in PCT patent application publication number WO 2016/133601.

These and other ultra-miniature ASICs are very small, typically having a 2-dimensional area in the range of, for example, 100 micrometers squared and a thickness in the range of about 50 micrometers or less. Looking at a United States penny, which depicts President Abraham Lincoln, a single ultra-miniature ASIC can fit on Lincoln's nose. The ultra-miniature ASICs e.g. RFID chips may be attached to a host component, such as a packaged integrated circuit (IC) chip. To differentiate the ultra-miniature ASIC referred from the host component, and because of its small size, the term "die" may be used to refer to the ultra-miniature ASIC.

"Unclonable" may refer to the inclusion in the miniaturized chip of an identification code that is protected from intrusion, e.g., by encryption. Implementations of these miniaturized chips can include, for example, electronic tags which are suitable for authenticating the provenance of electronics components, with the goal of detection and/or prevention of counterfeit parts, and other forms of supply chain quality assurance. These miniaturized, secure electronic tags may be used to provide "secure" versions of chip-sets or ICs, or to provide verification of the authenticity of products that are at risk of counterfeiting, such as consumer products, including high-end wine, apparel, watches, etc., as well as pharmaceuticals, medicines, devices (stents, for example), etc.

In some implementations, a custom electronic "die" of small form factor (e.g., in the range of about 100 um×100 um) is provided. These implementations can provide low cost per part, enabling wide-spread adoption. Some example implementations of the miniaturized electronic tag include full 256-bit encryption, secure nonvolatile key storage, and an unclonable intrusion sensor. In some designs of the disclosed electronic tags, power and data transfer can occur by inductive-coupling through (radio frequency) RF energy when in the near-field of a reader "probe." A custom reader probe may contain the appropriate RF frequency and power to communicate with the tag using both power and two-way data channels, e.g. by acting in a challenge/response protocol. A custom reader board may contain circuitry to receive data back from the die, and in conjunction with a secure link to a secure verification server process this encrypted data (e.g., cypher text) is used to determine the fidelity of the die. In some implementations, the die may be assembled within a package of a "known good" host IC, thereby allowing periodic checks, e.g., as the host component is routed through a supply chain.

The design includes (i) wafer-level testing and programming of ultra-miniature ASICs (where "ultra-miniature" includes an ASIC whose rectangular dimensions are so small that a disproportionate amount of silicon area is dedicated to test accessibility) and (ii) power coupling from a reader to the die, where a required coupling factor from reader to die is needed to ensure successful die operation.

For power coupling, dual reader-side coils can be used, in which one reader-side coil is used for a power channel (or channels) and another reader-side coil is used for a data channel (or channels). Corresponding dual-coils are provided on the die and are designed to operate at the chosen RF frequencies for power and data channels. The reader-side coils are configured to, for example, enable an optimal coupling factor to the die.

The disclosed technologies can benefit any ASIC design involved with ultra-miniature devices.

FIG. 10 illustrates a diagram of an embodiment of an exemplary slice programming word format 1100 for each OTP bit. The format is flexible in that it accommodates any number of dies per TAP circuit, and any chain length. A separate enable is provided for each OTP to provide individual control for soak/repair operations. An address field is included to support random addressing for soak/repair of particular OTP bits. The tester clock frequency so that the OTP programming circuit can count out the proper write pulse width. A field is allocated for the Q bit, the idea is that the OTP programming circuit will first "write" the bit; and then it will "read" the bit and place it into the Q field for verification back at the tester. Additional fields could be allocated to report other test status from the die (such as the result of a BIST).

The rate at which OTP bits need to be re-programmed (soaked) is expected to be on the order of 1 per 10,000 bits, or about 1 per 22.3 dies; so 1 or 2 repair/soak operations per slice. This design is based on the tester program tracking the failed programmings and issuing the repair/soak command at the offending address, enabling only the one device needing the repair.

The OTP programming and scantest circuitry for the illustrative design is fairly simple and is estimated to occupy about 300 um2 and will fit comfortably in the street (100 um×20 um=2000 um2 available).

Although not explicitly addressed, it should be mentioned that the illustrative design easily can be adapted to complete testing of the die:

Data format can include commands to control analog and/or digital built-in-self-test, and fields for a die to report results.

Figure 8:
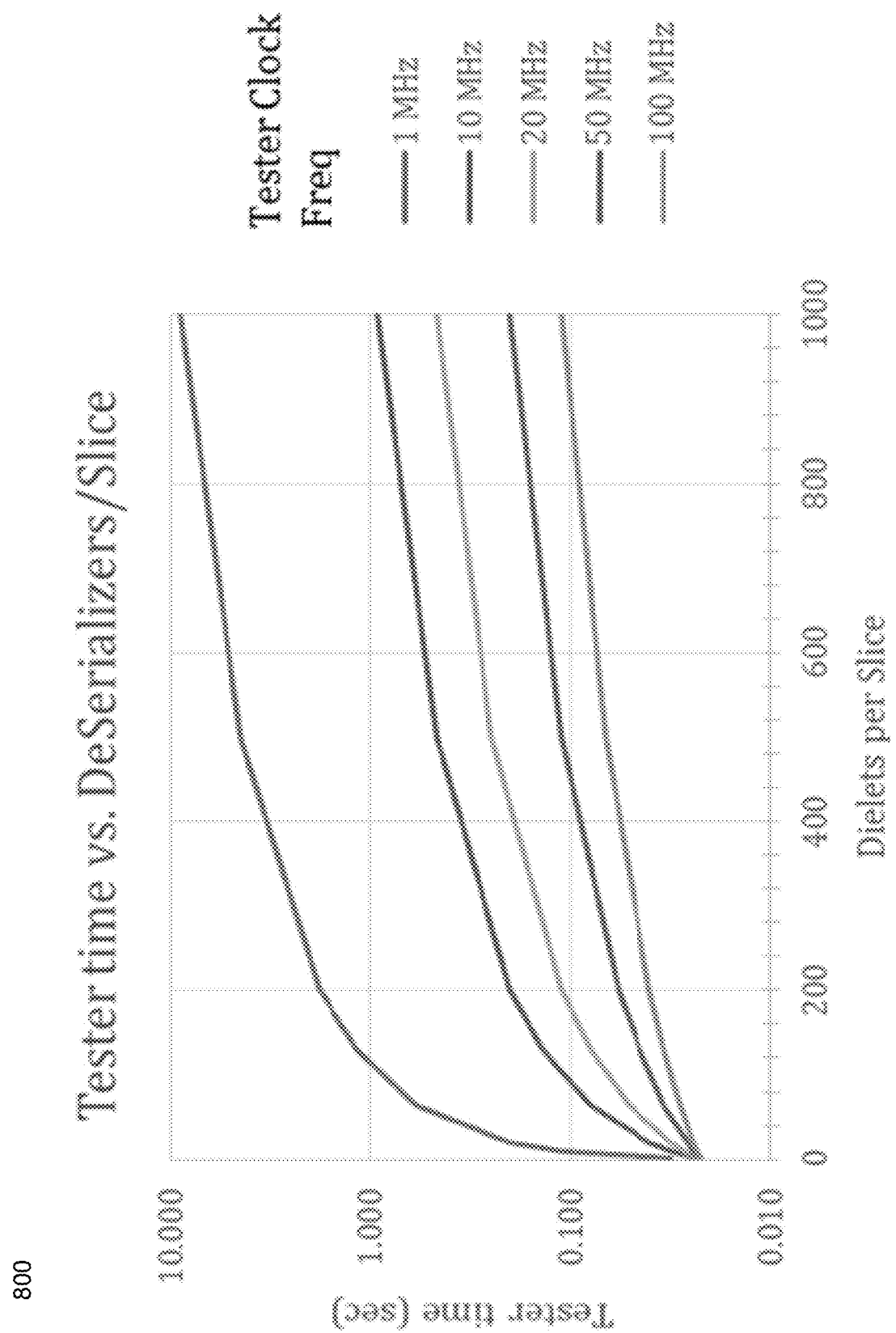
FIG. 8 illustrates a chart of an embodiment of an example tester time required to program a slice of OTPs as a function of slice size and tester frequency.

FIG. 8 illustrates a chart 800 of an embodiment of an example tester time required to program a slice of OTPs as a function of slice size and tester frequency. In an example, this chart 800 shows data based on 448 bits programmed (illustrative design) and a 22-bits per slice programming word. The test/programming time for this particular design, based on 64 de-serializers per slice, is 56 ms when using a 50 MHz tester clock. Scan test time, based on 700 FFs/die and 25 test vectors is about 46 ms additional.

A test group can be defined as including a number of slices according to the capabilities of the tester. For example, the Teradyne J750 can have 512 digital IOs. Since a slice requires 4 wires, it is possible to program 128 slices simultaneously. Doing the math, 128 slices/group×128 groups=16384 dies programmed and tested in ~50 ms. Within a test group, it is not necessary that all slices belong to the same reticle.

Note that the atomic unit is one slice, physically; the "test group" is purely conceptual—it is not part of the physical design and can be adapted to the tester capabilities after the fact.

Figure 9:
FIG. 9 illustrates a table of an embodiment of an example number of tester groups per wafer using different dies per group.

Continuing with the attributes of the illustrative design, the overall tester time for the wafer is now discussed. FIG. 9 illustrates a table 1000 of an embodiment of an example number of tester groups per wafer using different dies per group. In the example of FIG. 9, there are illustratively 122 groups for a wafer with 2,000,000 dies. 122×102 ms=12.44 sec. At $0.10/sec we calculate $1.244 per wafer for tester time. At 2 million dies per wafer, the test cost per wafer is negligible; at least for the OTP programming.

Referring back to FIG. 1, further improvement can be provided by packing the dies more closely within a slice while maintaining a standard spacing from slice-to-slice. This method provides area utilization improvement while still allowing the normal scribe-streets for sawing between slices and for WAT structures. As an example, reducing the scribe-street width to 40 um within the slice improves the area utilization within the slice from 31% to 51%. Using dry etch methods for ASIC singulation instead of a mechanical saw, the street-width can be 10 um or less, improving the slice area utilization to 83%.

FIG. 12 illustrates an embodiment of one or more computing devices 900 that can be a part of the system to manufacture an integrated circuit discussed herein. The computing device may include one or more processors or processing units 920 to execute instructions, one or more memories 930-932 to store information, one or more data input components 960-963 to receive data input from a user of the computing device 900, one or more modules that include the management module, a network interface communication circuit 970 to establish a communication link to communicate with other computing devices external to the computing device, one or more sensors where an output from the sensors is used for sensing a specific triggering condition and then correspondingly generating one or more preprogrammed actions, a display screen 991 to display at least some of the information stored in the one or more memories 930-932 and other components. Note, portions of this system that are implemented in software 944, 945, 946 may be stored in the one or more memories 930-932 and are executed by the one or more processors 920.

The system memory 930 includes computer storage media in the form of volatile and/or nonvolatile memory such as read-only memory (ROM) 931 and random access memory (RAM) 932. These computing machine-readable media can be any available media that can be accessed by computing system 900. By way of example, and not limitation, computing machine-readable media use includes storage of information, such as computer-readable instructions, data structures, other executable software, or other data. Computer-storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other tangible medium which can be used to store the desired information and which can be accessed by the computing device 900. Transitory media such as wireless channels are not included in the machine-readable media. Communication media typically embody computer readable instructions, data structures, other executable software, or other transport mechanism and includes any information delivery media.

The system further includes a basic input/output system 933 (BIOS) containing the basic routines that help to transfer information between elements within the computing system 900, such as during start-up, is typically stored in ROM 931. RAM 932 typically contains data and/or software that are immediately accessible to and/or presently being operated on by the processing unit 920. By way of example, and not limitation, the RAM 932 can include a portion of the operating system 934, application programs 935, other executable software 936, and program data 937.

The computing system 900 can also include other removable/non-removable volatile/nonvolatile computer storage media. By way of example only, the system has a solid-state memory 941. The solid-state memory 941 is typically connected to the system bus 921 through a non-removable memory interface such as interface 940, and USB drive 951 is typically connected to the system bus 921 by a removable memory interface, such as interface 950.

A user may enter commands and information into the computing system 900 through input devices such as a keyboard, touchscreen, or software or hardware input buttons 962, a microphone 963, a pointing device and/or scrolling input component, such as a mouse, trackball or touch pad. These and other input devices are often connected to the processing unit 920 through a user input interface 960 that is coupled to the system bus 921, but can be connected by other interface and bus structures, such as a parallel port, game port, or a universal serial bus (USB). A display monitor 991 or other type of display screen device is also connected to the system bus 921 via an interface, such as a display interface 990. In addition to the monitor 991, computing devices may also include other peripheral output devices such as speakers 997, a vibrator 999, and other output devices, which may be connected through an output peripheral interface 995.

The computing system 900 can operate in a networked environment using logical connections to one or more remote computers/client devices, such as a remote computing system 980. The remote computing system 980 can a personal computer, a mobile computing device, a server, a router, a network PC, a peer device or other common network node, and typically includes many or all of the elements described above relative to the computing system 900. The logical connections depicted in FIG. 5 can include a personal area network (PAN) 972 (e.g., Bluetooth®), a local area network (LAN) 971 (e.g., Wi-Fi), and a wide area network (WAN) 973 (e.g., cellular network), but may also include other networks such as a personal area network (e.g., Bluetooth®). Such networking environments are commonplace in offices, enterprise-wide computer networks, intranets and the Internet. A browser application may be resident on the computing device and stored in the memory.

When used in a LAN networking environment, the computing system 900 is connected to the LAN 971 through a network interface 970, which can be, for example, a Bluetooth® or Wi-Fi adapter. When used in a WAN networking environment (e.g., Internet), the computing system 900 typically includes some means for establishing communications over the WAN 973. With respect to mobile telecommunication technologies, for example, a radio interface, which can be internal or external, can be connected to the system bus 921 via the network interface 970, or other appropriate mechanism. In a networked environment, other software depicted relative to the computing system 900, or portions thereof, may be stored in the remote memory storage device. By way of example, and not limitation, the system has remote application programs 985 as residing on remote computing device 980. It will be appreciated that the network connections shown are examples and other means of establishing a communications link between the computing devices that may be used.

As discussed, the computing system 900 can include mobile devices with a processing unit 920, a memory (e.g., ROM 931, RAM 932, etc.), a built in battery to power the computing device, an AC power input to charge the battery, a display screen, a built-in Wi-Fi circuitry to wirelessly communicate with a remote computing device connected to network.

It should be noted that the present design can be carried out on a computing system such as that described with respect to shown herein. However, the present design can be carried out on a server, a computing device devoted to message handling, or on a distributed system in which different portions of the present design are carried out on different parts of the distributed computing system.

In some embodiments, software used to facilitate algorithms discussed herein can be embodied onto a non-transitory machine-readable medium. A machine-readable medium includes any mechanism that stores information in a form readable by a machine (e.g., a computer). For example, a non-transitory machine-readable medium can include read-only memory (ROM); random access memory (RAM); magnetic disk storage media; optical storage media; flash memory devices; Digital Versatile Disc (DVD's), EPROMs, EEPROMs, FLASH memory, magnetic or optical cards, or any type of media suitable for storing electronic instructions.

Note, an application described herein includes but is not limited to software applications, mobile applications, and programs that are part of an operating system application. Some portions of this description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. These algorithms can be written in a number of different software programming languages such as C, C+, HTTP, Java, or other similar languages. Also, an algorithm can be implemented with lines of code in software, configured logic gates in software, or a combination of both. In an embodiment, the logic consists of electronic circuits that follow the rules of Boolean Logic, software that contain patterns of instructions, or any combination of both. Any portions of an algorithm implemented in software can be stored in an executable format in portion of a memory and is executed by one or more processors.

It should be borne in mind, however, that all of these and similar terms are to be associated with the appropriate physical quantities and are merely convenient labels applied to these quantities. Unless specifically stated otherwise as apparent from the above discussions, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers, or other such information storage, transmission or display devices.

Many functions performed by electronic hardware components can be duplicated by software emulation. Thus, a software program written to accomplish those same functions can emulate the functionality of the hardware components in input-output circuitry. Thus, provided herein are one or more non-transitory machine-readable medium configured to store instructions and data that when executed by one or more processors on the computing device of the foregoing system, causes the computing device to perform the operations outlined as described herein.

References in the specification to "an embodiment," "an example", etc., indicate that the embodiment or example described may include a particular feature, structure, or characteristic, but every embodiment may not necessarily include the particular feature, structure, or characteristic. Such phrases can be not necessarily referring to the same embodiment. Further, when a particular feature, structure, or characteristic is described in connection with an embodiment, it is believed to be within the knowledge of one skilled in the art to affect such feature, structure, or characteristic in connection with other embodiments whether or not explicitly indicated.

While the foregoing design and embodiments thereof have been provided in considerable detail, it is not the intention of the applicant(s) for the design and embodiments provided herein to be limiting. Additional adaptations and/or modifications are possible, and, in broader aspects, these adaptations and/or modifications are also encompassed. Accordingly, departures may be made from the foregoing design and embodiments without departing from the scope afforded by the following claims, which scope is only limited by the claims when appropriately construed.

What is claimed is:

1. A method of manufacturing an integrated circuit, comprising:
   creating a wafer with a plurality of dies, where each die contains its own integrated circuit that needs its integrity verified;
   fabricating test circuitry, including one or multiple instances of test access port (TAP) circuits, located in a margin between one or more dies of the wafer;
      fabricating on the wafer a first row of test pads and power pads per group of dies on the wafer, where the first row of test pads and power pads is electrically connected and shared among all of the dies in that group, where multiple test pads and multiple power pads connect to multiple instances of the TAP circuits in order to supply operating power as well as testing and/or programming data to verify the integrity of each die in that group of dies, instantiating two or more parallel data buses between columns of dies to route data shifted out of the TAP circuits, where the instances of the TAP circuits are connected in a scan chain and are configured to send test data to their adjacent dies, and where the instances of the TAP circuits connected to a first column of dies then send their output data on a first data bus in parallel to the instances of the TAP circuits connected to a second column of dies, which the TAP circuits connected to the second column of dies then send their output data on a second data bus, which both effectively cuts down a length of the scan chain of TAP circuits to save testing time and simplifies keeping track of the output data from the columns of dies.

2. The method of claim 1, further comprising: singulating the dies to create each instance of the integrated circuit, and during the singulation process the multiple instances of TAP circuits located in the margin between the dies are destroyed.

3. A method of manufacturing an integrated circuit, comprising:

creating a wafer with a plurality of dies, where each die contains its own integrated circuit that needs its integrity verified;

fabricating test circuitry, including one or multiple instances of test access port (TAP) circuits, located in a margin between one or more dies of the wafer;

fabricating on the wafer a first row of test pads and power pads per group of dies on the wafer, where the first row of test pads and power pads is electrically connected and shared among all of the dies in that group, where multiple test pads and multiple power pads connect to multiple instances of the TAP circuits in order to supply operating power as well as testing and/or programming data to verify the integrity of each die in that group of dies, where each TAP circuit has a scalable controller to interface with two or more dies; each TAP circuit also includes logic to access circuitry of connected dies undergoing a scan test, where an external tester accesses the TAP circuits via the first row of test pads and power pads per group of dies on the wafer, where the TAP circuit also includes logic to access and program information for an embedded memory of the connected dies; and where the TAP circuit also includes mode circuitry to configure routing paths and components in the TAP circuit to supply the scan test data and collect the resulting scan test data as well as to configure routing paths and components in the TAP circuit to program information for each individual die connected to the TAP circuit, where two or more dies connect to each TAP circuit, where each TAP circuit further contains at least a state machine to individualize the programming information in the embedded memory of each connected die, where the embedded memory is an embedded read-only memory, where the programming information is one-time programming information of security content that is programmed into the embedded read-only memory of a connected die, and where programmed security content in the embedded read only memory of a first die connected to that TAP circuit is different in security content than security content programmed into the embedded read only memory of a second die connected to that TAP circuit.

4. The method of claim 1, where the first row of test pads and power pads are geographically located on the wafer external to the dies in the group, and, after a singulation process, are no longer connected to the dies.

5. The method of claim 1, where the multiple instances of TAP circuits are connected serially within the group, where the first and last TAP circuit in the serial chain of instances of TAP circuits are connected to the first row of test pads and power pads for that group of dies, where an external tester supplies data and makes connections die, where an entire group of dies is tested by that external tester with essentially a same set of data and connections as if that external tester is testing a single die.

6. The method of claim 1, where the instances of the TAP circuits contain circuitry for both scan data testing and performing programming values in memories on each connected die, as well as contain circuitry for switching modes between scan data testing and performing programming values.

7. A method of manufacturing an integrated circuit, comprising:

creating a wafer with a plurality of dies, where each die contains its own integrated circuit that needs its integrity verified;

fabricating test circuitry, including one or multiple instances of test access port (TAP) circuits, located in a margin between one or more dies of the wafer;

fabricating on the wafer a first row of test pads and power pads per group of dies on the wafer, where the first row of test pads and power pads is electrically connected and shared among all of the dies in that group, where multiple test pads and multiple power pads connect to multiple instances of the TAP circuits in order to supply operating power as well as testing and/or programming data to verify the integrity of each die in that group of dies, and where a first integrated circuit resulting from a die fabricated on the wafer is an Application Specific Integrated Circuit with Radio Frequency Identification components and circuitry for authentication, and where the ASIC contains a password in its memory because the fabricated ASIC, after a singulation process, has no test pads or power pads geographically on the singulated ASIC for wires of an external tester to connect to.

8. A method of manufacturing an integrated circuit, comprising:

creating a wafer with a plurality of dies, where each die contains its own integrated circuit that needs its integrity verified;

fabricating test circuitry, including one or multiple instances of test access port (TAP) circuits, located in a margin between one or more dies of the wafer;

fabricating on the wafer a first row of test pads and power pads per group of dies on the wafer, where the first row of test pads and power pads is electrically connected and shared among all of the dies in that group, where multiple test pads and multiple power pads connect to multiple instances of the TAP circuits in order to supply operating power as well as testing and/or programming data to verify the integrity of each die in that group of dies, instantiating two or more parallel data buses between columns of dies to route data shifted out of the TAP circuits, where the instances of the TAP circuits are connected in a scan chain and are configured to send test data to their adjacent dies, and where the instances of the TAP circuits connected to a first column of dies then send their output data on a first data bus in parallel to the instances of the TAP circuits connected to a second column of dies, which the TAP circuits connected to the second column of dies then send their output data on a second data bus, which both effectively cuts down a length of the scan chain of TAP circuits to save testing time and simplifies keeping track of the output data from the columns of dies.

9. The method of claim 1, further comprising:
supplying the operating power as well as the testing data and the programming data, with a first TAP circuit in order to verify the integrity of each die connected to the first TAP circuit.

10. The method of claim 1, further comprising:
performing both parallel testing and programming on the group of dies as well as to multiple dies connected to each TAP circuit in the multiple instances of the TAP circuits.

11. The integrated circuit produced by the process of claim 1.

12. An apparatus, comprising:
an integrated circuit with a one-time programmable memory that has no input pads or power input pads, where each die fabricated on a wafer geographically has no test pad or other input pad instantiated on the die itself; and instead, is configured to receive its test signaling and power from a first row of test pads and power pads per group of dies on the wafer during a fabrication and testing process, and where the integrated circuit resulting from the die has an inductive-capacitive circuit to wirelessly receive its operational power during its operation from an external wireless reader because the first row of test pads and power pads were severed off during a die singulation process.

13. The apparatus of claim 12, where the integrated circuit is an Application Specific Integrated Circuit with Radio Frequency Identification components and circuitry for tracking, and where the ASIC contains a password in its memory because the fabricated ASIC, after a singulation process, has no test pads or power pads geographically on the singulated ASIC for wires of an external tester to connect to.

14. An apparatus, comprising:
a test access port (TAP) circuit that contains circuitry for both scan data testing and performing programming values in memories on each connected die, as well as contains circuitry for switching modes between scan data testing and performing programming values, where the TAP circuit has a scalable controller to interface with two or more dies on a wafer, and
where two or more dies connect to each TAP circuit, where each TAP circuit further contains at least a state machine and counter to individualize the programming information in the embedded memory of each connected die.

15. The apparatus of claim 14, where the TAP circuit is geographically fabricated in a margin between dies on the wafer; where the TAP circuit further includes logic to access circuitry of connected dies undergoing a scan test, where the TAP circuit further includes logic to access and program information into an embedded memory of the connected dies; and where the TAP circuit further includes mode circuitry to configure routing paths and components in the TAP circuit to supply the scan test data and collect the resulting the scan test data as well as to configure routing paths and components in the TAP circuit to program information for each individual die connected to the TAP circuit.

16. The apparatus of claim 14, where the TAP circuit is configured to couple to a first test pad and a first power pad fabricated on the wafer, where an external tester accesses the TAP circuitry via the first test pad and power pad, where the first test pad and first power pad are geographically located on the wafer external to the dies, and, after a singulation process, are no longer connected to the dies or the TAP circuit.

17. The apparatus of claim 14, where the embedded memory is an embedded read-only memory, where the programming information into the embedded read-only memory is one time programming information of security content in the embedded read-only memory a connected die, and where programmed security content in the embedded read-only memory of a first die connected to that TAP circuit is different in security content than security content programmed into the embedded read-only memory of a second die connected to that TAP circuit.

* * * * *